United States Patent [19]
Boudon et al.

[11] Patent Number: 4,950,927
[45] Date of Patent: Aug. 21, 1990

[54] LOGIC CIRCUITS FOR FORMING VLSI LOGIC NETWORKS

[75] Inventors: Gerard Boudon, Mennecy; Armand Brunin, Le Mee/Seine; Bernard Denis, Mennecy; Pierre Mollier, Boissise Le Roi; Philippe Stoppa, Paris, all of France

[73] Assignee: International Business Machines Corporation, Armonk, N.Y.

[21] Appl. No.: 403,062

[22] Filed: Sep. 5, 1989

Related U.S. Application Data

[63] Continuation of Ser. No. 236,299, Aug. 23, 1988, abandoned, which is a continuation of Ser. No. 946,666, Dec. 24, 1986, abandoned, which is a continuation of Ser. No. 619,680, Jun. 11, 1984, abandoned.

[30] Foreign Application Priority Data

Jun. 30, 1983 [FR] France .............................. 83 430022

[51] Int. Cl.$^5$ ................. H03K 19/084; H03K 19/173
[52] U.S. Cl. .................................... 307/457; 307/454; 307/455; 307/458; 307/465; 307/466
[58] Field of Search ............................... 307/454-455, 307/451-458, 465-466

[56] References Cited

U.S. PATENT DOCUMENTS

| | | | |
|---|---|---|---|
| T957,007 | 4/1977 | Jordan et al. ...................... | 307/458 |
| 3,400,278 | 9/1968 | Walsh .................................. | 307/457 |
| 3,751,680 | 8/1973 | Hodges ............................... | 307/458 |
| 3,808,475 | 4/1974 | Buelow et al. ...................... | 357/45 |
| 3,836,789 | 9/1974 | Struk et al. ......................... | 307/203 |

FOREIGN PATENT DOCUMENTS

| | | |
|---|---|---|
| 2234713 | 4/1974 | France . |
| 0011700 | 10/1979 | France . |
| 2035688 | 6/1980 | United Kingdom . |

OTHER PUBLICATIONS

I.B.M. Tech. Disc. Bul. Farley et al., vol. 21, No. 5, 10/78.
I.B.M. Tech. Disc. Bul. Giuliani et al., vol. 21, No. 3, 8/78.
I.B.M. Tech. Disc. Bul. Klara et al., vol. 19, No. 9, 2/77.
I.B.M. Tech. Disc. Bul. Beranger, vol. 25, No. 1, 6/82.
I.B.M. Tech. Disc. Bul. BaHista et al., vol. 21, No. 11, 4/79.
I.B.M. Tech. Disc. Bul., vol. 21, No. 5, 10/78.
I.B.M. Tech. Disc. Bul., vol. 19, No. 9, 2/77.
I.B.M. Tech. Disc. Bul., vol. 21, No. 11, 4/79.
Application Note 90.80, G. E., "Microelectronics Using G. E. Emitter-Coupled Logic Operators" by E. F. Kvamme.
I.B.M. Tech. Disc. Bul., vol. 21, No. 11, Apr. 1979, p. 4515, "Integrated Logic Circuit".
IBM Technical Disclosure Bulletin, vol. 25, No. 1, Jun. 1982.
"N-Way and Circuit and Multiplex Circuit for $T_2L$ Family", by H. Beranger.
IBM Technical Disclosure Bulletin, vol. 21, No. 5, Oct. 1978 "Address Decoder Without a True-Complement Generator", by R. T. Farley and H. D. Varadarajan.
IBM Technical Disclosure Bulletin, vol. 21, No. 3, Aug. 1978, "Three-State Driver", by S. W. Giuliani and S. J. Park.
IBM Technical Disclosue Bulletin, vol. 19, No. 9, Feb. 1977, "Cascode $T^2L$ Circuit" by W. S. Klara and D. C. Reedy.
IBM Technical Disclosue Bulletin, vol. 21, No. 11, Apr. 1979.
"Integrated Logic Circuit", by M. Battista, E. F. Culican, S. W. Giuliani, F. H. Lohrey and S. J. Park.

Primary Examiner—Stanley D. Miller
Assistant Examiner—Margaret R. Wambach
Attorney, Agent, or Firm—Graham S. Jones, II.

[57] ABSTRACT

A DTT type basic logic circuit exhibiting improved immunity to noise and including input diodes for receiving input signals A, B, ...; an input transistor the emitter of which receives an additional input signal X and the base of which is connected to the anodes of the input diodes; and an output inverter transistor disposed so that the signal at the output thereof represents the logic function $\overline{X(AB\ldots)}$. From this circuit, a family of logic circuits suitable for realizing very-large-scale-integration logic networks in a master slice can be developed. The master slice comprises general-purpose cells in which pre-diffused semiconductor elements can be interconnected to form the desired circuits.

17 Claims, 11 Drawing Sheets

LOGIC CIRCUITS FOR FORMING VLSI LOGIC NETWORKS

This case is a continuation of application Ser. No. 236,299, abandoned, filed 8/23/88 which is continuation of application Ser. No. 946,666, abandoned 12/24/86 which is a continuation of application Ser. No. 619,680, filed 6/11/84 now abandoned.

BACKGROUND OF THE INVENTION

1. Technical Field

This invention relates to a basic logic circuit from which a family of logic circuits can be developed to form logic networks using very large scale integration (VLSI) techniques.

2. Background Art

Existing data processing systems are largely comprised of pre-diffused logic networks. By simplifying the design of these networks, the cost of the systems can be reduced. To this end, networks comprised of general-purpose cells of the type described in U.K. Patent Application No. 2,025,688 may be used. This cell consists of emitter-coupled logic (ECL) circuits and is, therefore, mainly used in networks which must operate at high speeds but do not require high component densities. In applications of this type, master slices in which basic cells performing an elementary logic function such as NAND have been diffused are generally used. The master slice is then customized by appropriately interconnecting the cells to produce the desired network.

The type of basic cell that comprises a Transistor-Transistor-Logic (TTL) NAND gate as described in French patent No. 2,234,713 (U.S. Pat. No. 3,836,789) has the disadvantages of being slow and unsuitable for large-scale integration. This is due to the fact that many cells are required to enable this NAND gate to perform certain logic functions.

Also, the type of basic cell that comprises a Diode-Transistor-Logic (DTL) gate has the disadvantage, in addition to being unsuitable for large-scale integration, of exhibiting a poor immunity to noise because of its low switching level.

Today's technologies make it possible to manufacture integrated networks which have four levels of metallization. Thus, it is no longer necessary to provide separations between the cells of the network, which usually are arranged to form a matrix, to make the necessary interconnections as these can now be effected at the various levels of metallization. For example, the components of a given cell can be interconnected at the first level, the vertical wiring channels can be provided at the second level, and the horizontal ones at the third level. The size of the cell is determined, according to the number of cells to be interconnected, by the respective spacings of the horizontal and vertical wiring channels. As a result, the component density of logic networks comprised of conventional NAND gates can no longer be increased since each cell must occupy a specific area.

It is, therefore, an object of this invention to provide a basic logic circuit that can be used for realizing a general-purpose cell capable of performing many logic functions.

It is another object of this invention to provide such a logic circuit with a view to improving the cost-to-performance ratio of master slices used in logic networks.

It is still another object of this invention to provide such a circuit with a view to realizing very-large-scale-integration logic networks that require low supply voltages.

SUMMARY OF THE INVENTION

The elementary circuit of the present invention allows a basic logic function to be performed using n input signals A, B, ... etc, and an additional input signal X. The circuit includes n input low-barrier Schottky-diodes (D1-Dn) having first electrodes each of which receives one of the n input signals and second electrodes connected to a common node, itself connected through a resistor to a first low-voltage supply (+1.7 volt), and an input transistor that has its base connected to the common node, the emitter of which receives the additional logic signal X, and the collector of which is connected through a resistor to the first supply voltage. An output inverter transistor has its base connected to the collector of the input transistor, its emitter connected to a second supply voltage (0 volt), and its collector connected to the first supply voltage through a resistor, so that the logic level obtained at the collector of the output transistor will represent the function $\overline{X}$ (AB ... ).

From this elementary circuit, one can form a family of logic circuits that may be termed DTTL (Diode-Transistor-Transistor-Logic) since they will act both as DTL and TTL circuits. Each logic circuit may consist either of several elementary circuits or of several input transistors inserted in an elementary circuit. Either one additional input signal or different additional input signals can be fed to the emitters of all input transistors. The bases of the input transistors are connected to one or more input diodes to which the input signals (A,B,C,D, ... ) are fed.

The logic circuits of said family are formed in a general-purpose cell in which semiconductor components such as diodes, transistors and resistors are implanted and pre-diffused, so that, by interconnecting appropriate components at the first level of metallization, all desired logic circuits can be formed. The cells are then interconnected at the second and third levels of metallization to form logic networks that exhibit high component densities and perform very satisfactorily.

These and other objects, features and advantages of the invention will be apparent from the following more particular description of the preferred embodiments of the invention as illustrated in the drawings.

DETAILED DESCRIPTION OF THE INVENTION

Figure 1A:
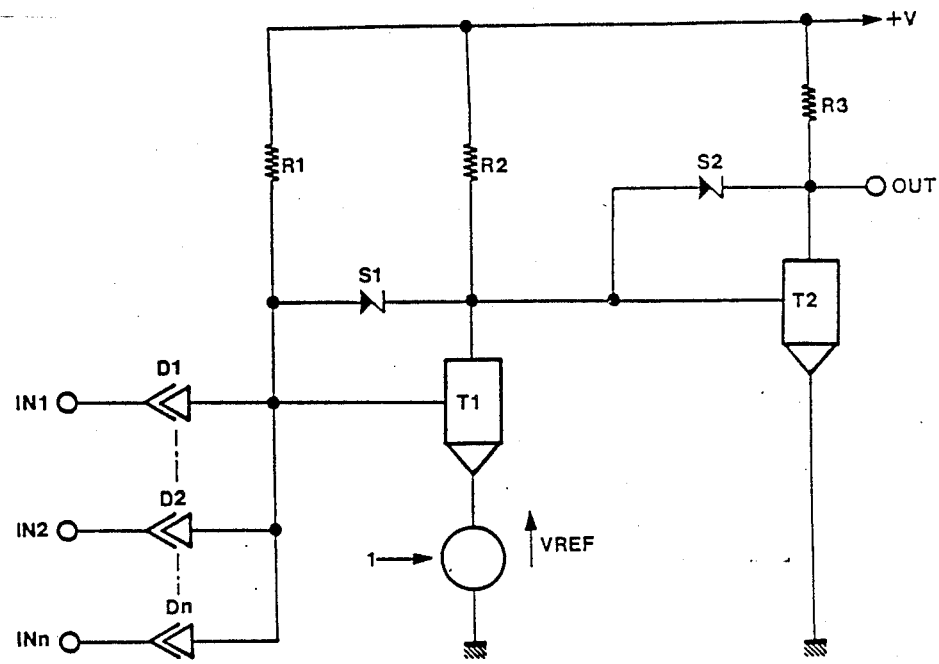
FIGS. 1A and 1B illustrate elementary DTTL circuits in accordance with the invention.
Figure 1B:
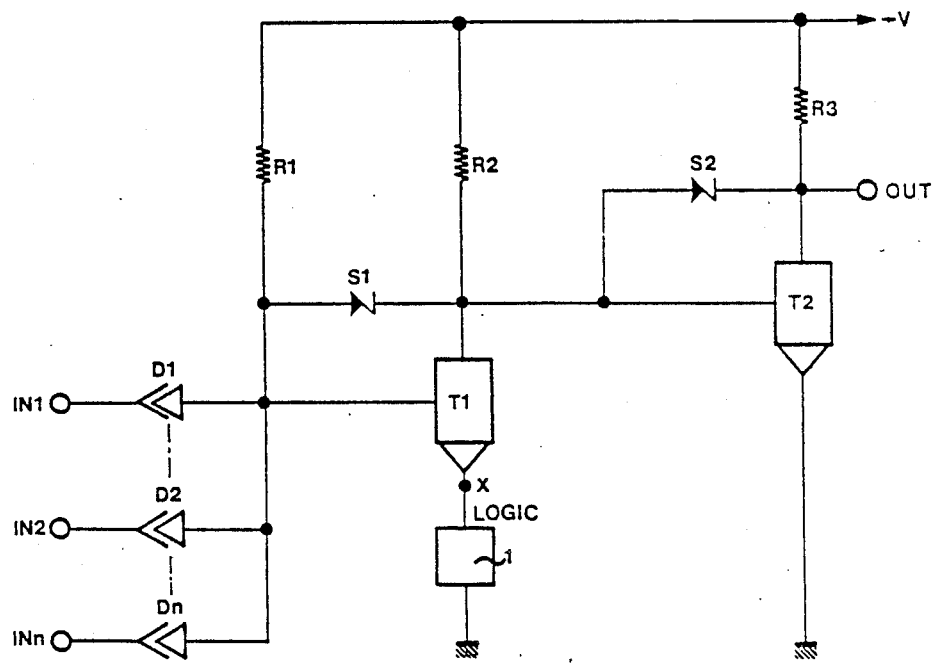

Referring now to FIGS. 1A and 1B, the basic logic circuit of the invention is shown. This circuit constitutes an AND gate from which a family of DTTL (Diode-Transistor-Transistor-Logic) circuits may be developed. As shown, the circuit includes low-barrier Schottky diodes D1, D2, ..., Dn. The cathodes of these diodes form the input terminals IN1, IN2, ..., INn of the circuit to which input signals A, B, ... etc, are fed. The anodes are connected together to the base of an input NPN transistor T1, on the one hand, and, through an implanted resistor R1, to a supply voltage +V, on the other hand. In a preferred embodiment, the chosen value of +V is equal to 1.7 volt. The collector of transistor T1 is connected to +V through an implanted resistor R2, and its emitter is connected to ground through a circuit 1. The collector of T1 is connected to the base of an output inverter transistor T2. The emitter of T2 is connected to ground and its collector is connected to supply voltage +V through an implanted resistor R3. The output signal from the circuit is obtained at the output terminal (OUT) of the collector of transistor T2. Two antisaturation high-barrier Schottky diodes S1 and S2 are disposed between the collector and the base of transistors T1 and T2. One notable feature of this circuit is that the emitter of transistor T1 is connected to ground through circuit 1.

The circuit 1 may be comprised either of a reference voltage source VREF equal to the collector-emitter voltage VCE of a NPN transistor, i.e., 0.3 volts, as shown in FIG. 1A, or of some other logic circuit whose output signal X is applied to the emitter of transistor T1, as shown in FIG. 1B. Thus, cascode logic circuits can be formed, as will later be described, thereby increasing the logic capability of the basic circuit of FIG. 1A.

When at least one of the signals applied to inputs IN1–INn is low, that is, when its value is less than a threshold Vt preferably equal to 0.3 volts (the VCE of a transistor), the corresponding input diode(s) D1–Dn is (are) forward biased and as a result transistor T1 is off. Since the voltage at the collector of T1 is at a high level, transistor T2 is on and the output signal is at a low level equal to the VCE of T2.

When the signals applied to inputs IN1–INn are high, the input diodes are off and transistor T1 is on; therefore, transistor T2 is off and the output signal is high. Thus, the basic circuit of FIG. 1A performs the AND function of the signals applied to its inputs.

The threshold voltage is:

$$VREF + VBE(T1) - VS \approx 0.3 + 0.8 - 0.3 \approx 0.8 \text{ volts}$$

where VBE(T1) is the base-emitter voltage of transistor T1, and VS is the voltage across a Schottky diode when forward biased.

The immunity to noise (VIM) of the circuit is:

$$VT - VIN \approx VT - VCE \approx 0.5 \text{ volts}$$

This figure is twice the value of the noise immunity of conventional DTL or TTL circuits. This allows the number of inputs and outputs to be significantly increased and makes it easier to design logic networks.

The operation of the circuit of FIG. 1B is as follows. Signal X represents the result of a logic function performed by circuit 1. Since this circuit is of the same type as the circuit of FIG. 1A, the level of signal X is equal either to VCE (low level) or to about 1.7 volts (high level). If the low level of signal X is equal to VCE, then the circuit of FIG. 1B operates in the same manner as that of FIG. 1A and provides an output signal in accordance with the levels of the signals applied to inputs IN1–INn. If signal X is high, regardless of the levels of the signals applied to inputs IN1–INn, then transistor T1 will never conduct and therefore the output signal will always be low. Thus, the circuit of FIG. 1B performs the logic function $(AB \ldots )\overline{X}$.

The manner in which this basic circuit can be used as a building block for developing a family of logic circuits will now be described.

Figure 2:
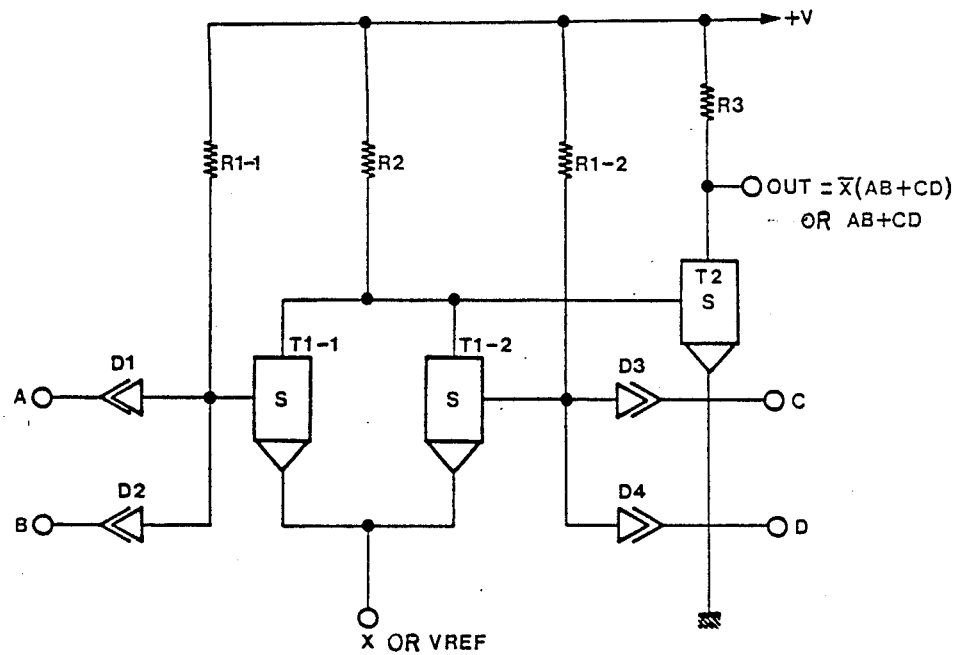
FIG. 2 shows a first logic circuit of the DTTL family for performing the logic function $\overline{X}$ (AB+CD) or (AB+CD)
Figure 3:
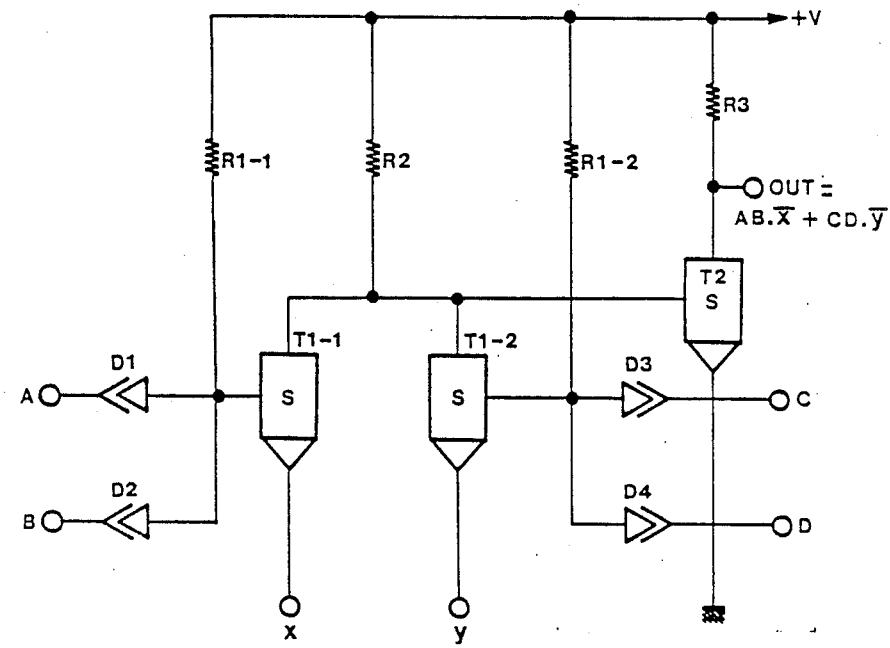
FIG. 3 shows a second logic circuit of the DTTL family for performing the logic function $AB\overline{X}+CD\overline{Y}$.
Figure 4:
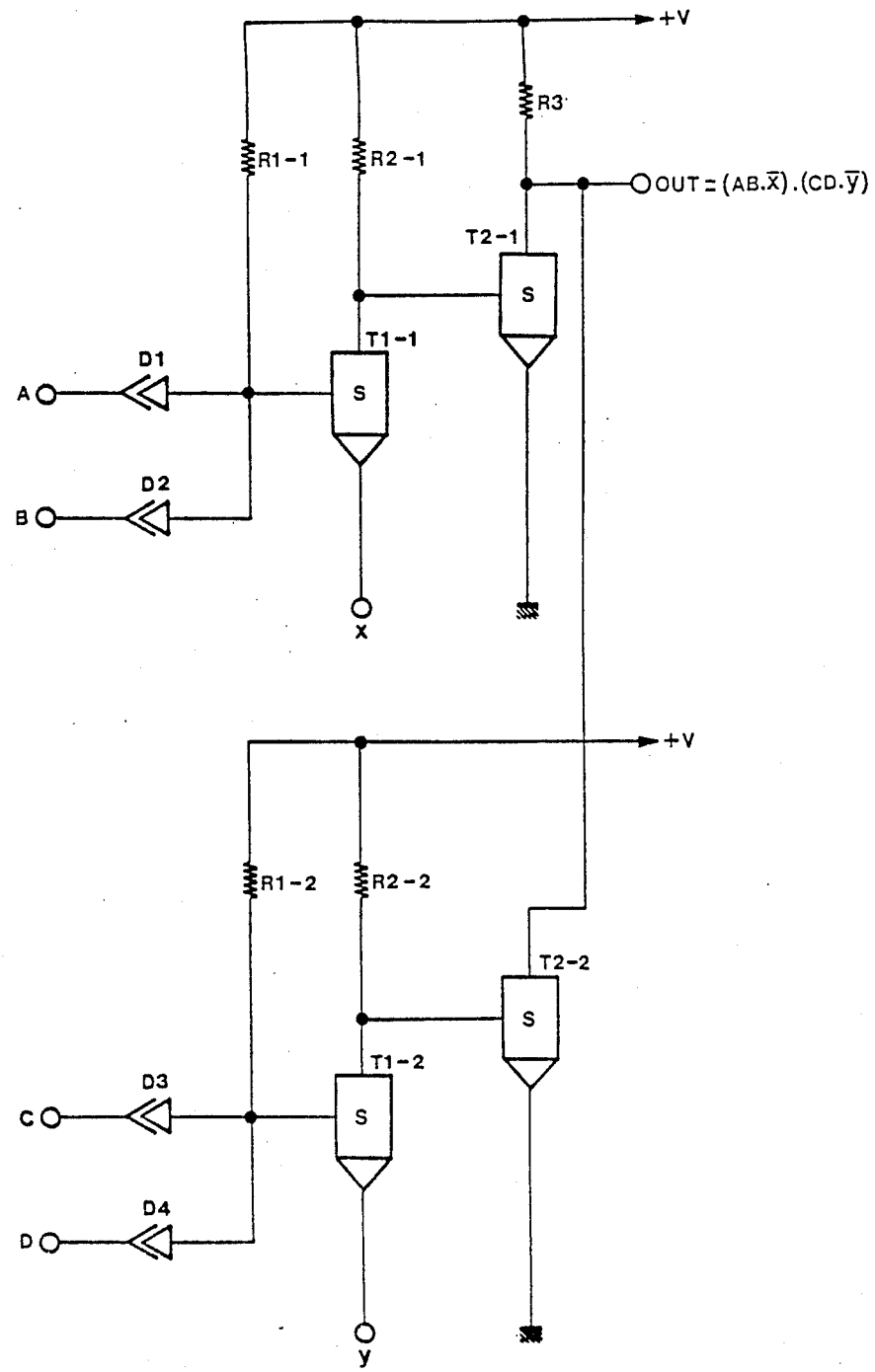
FIG. 4 shows a third logic circuit of the DTTL family for performing the logic function $(AB\overline{X}).(CD\overline{Y})$.

Three circuits of the family of logic circuits are shown by way of example in FIGS. 2, 3 and 4. The circuit of FIG. 2 includes two input transistors T1-1 and T1-2 provided with antisaturation Schottky diodes (represented by the letter S), and four input low-barrier Schottky diodes D1–D4. Two input signals A and B are applied to the cathodes of diodes D1 and D2, which have their anodes connected to the base of transistor T1-1. Two input signals C and D are applied to the cathodes of diodes D3 and D4, which have their anodes connected to the base of transistor T1-2. The bases of T1-1 and T1-2 are connected to supply voltage V through resistors R1-1 and R1-2, respectively. The collectors of T1-1 and T1-2 are connected together and also to supply voltage +V through a resistor R2, as well as to the base of output inverter transistor T2; the collector of T2 is connected to supply voltage +V through resistor R3, and its emitter is connected to ground, as in the circuit of FIGS. 1A or 1B.

Let us now assume that the voltage at the emitters of transistors T1-1 and T1-2 is equal to VREF or that signal X is low.

If either of the input signals A or B is low and if either of signals C or D is low, or if all of signals A–D are low, then transistors T1-1 and T1-2 are off, output transistor T2 is on, and therefore the output signal OUT is low. If either of signals A and B is low and if both of signals C and D are high, then T1-1 is off and T1-2 is on, hence T2 is off and the output signal is high. If either of signals C and D is low and if both of signals A and B are high, then T1-2 is off and T1-1 is on, hence T2 is off and the output signal is high. However, if signal X is high, regardless of the levels of input signals A–D, then T1-1 and T1-2 will always be off, T2 will be on and the output signal will be low. Accordingly, depending on whether the emitters of T1-1 and T1-2 are connected to the output X of a logic circuit or to reference voltage VREF, the circuit of FIG. 2 will perform the logic function $\overline{X}(AB+CD)$ or $AB+CD$.

The circuit of FIG. 3 is identical to that of FIG. 2, except that the emitters of T1-1 and T1-2 receive output signals X and Y from separate logic circuits instead of being connected together, so that the circuit performs the logic function $AB\overline{X}+CD\overline{Y}$.

Referring now to FIG. 4, a circuit comprised of two circuits of the type illustrated in FIG. 1B is shown. This circuit comprises two input transistors T1-1 and T1-2 and two output transistors T2-1 and T2-2. Input transistors T1-1 and T1-2 have their bases connected to the anodes of input diodes D1, D2 and D3, D4 as in the FIG. 3 arrangement. The cathodes of diodes D1–D4 receive input signals A–D, respectively. The anodes of diodes D1 and D2 are connected to supply voltage +V through a resistor R1-1, and the anodes of diodes D3 and D4 are connected to +V through a resistor R1-2. The collectors of T1-1 and T1-2 are respectively connected to the bases of the first and second output transistors T2-1 and T2-2. The collectors of T2-1 and T2-2 are connected together and, in addition, to voltage +V through a resistor R3. The signal obtained at output OUT is taken from the common collectors of the two output transistors, so that the circuit of FIG. 4 performs the logic function (AB$\overline{X}$).(CD$\overline{Y}$).

Other layouts may be devised such that the basic circuit of FIGS. 1A or 1B could be used as a building block which, in addition to exhibiting a very high immunity to noise, would have an enhanced capability of performing logic functions. Since X and Y represent the result of a complex function, i.e., of any logic function of several input variables, logic networks provided with minimum-length connections can be formed by disposing several circuit layers in a cascode-type configuration.

To make it easier to design logic networks from this family of DTTL circuits, a master slice is used in which general-purpose cells are conventionally laid out in the form of rows and columns. Semiconductor elements such as diodes, transistors and resistors are prediffused in each cell but are not interconnected. The desired logic network is realized by customizing the master slice, that is, by interconnecting the elements of each cell and by interconnecting the various cells so that it can perform a desired function.

Figure 5A:
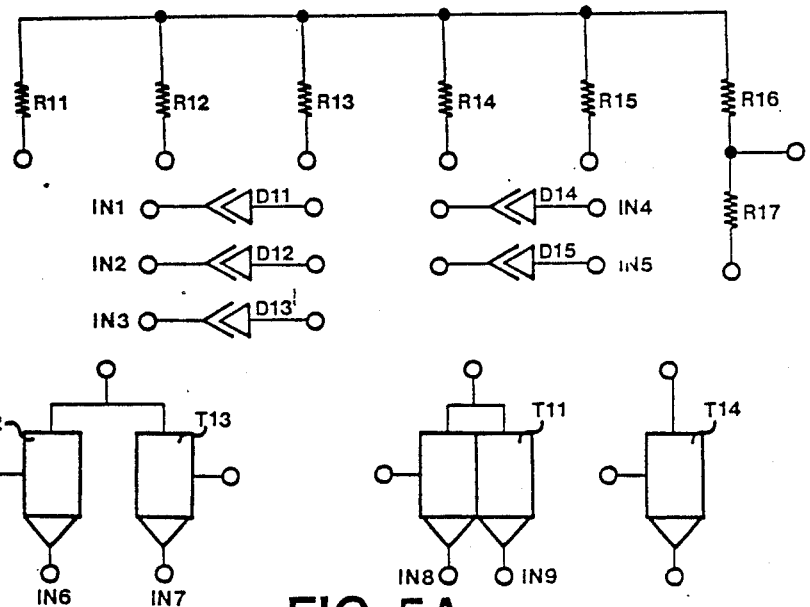
FIGS. 5A and 5B show a general-purpose cell serving to form the circuits of the logic family.
Figure 5B:
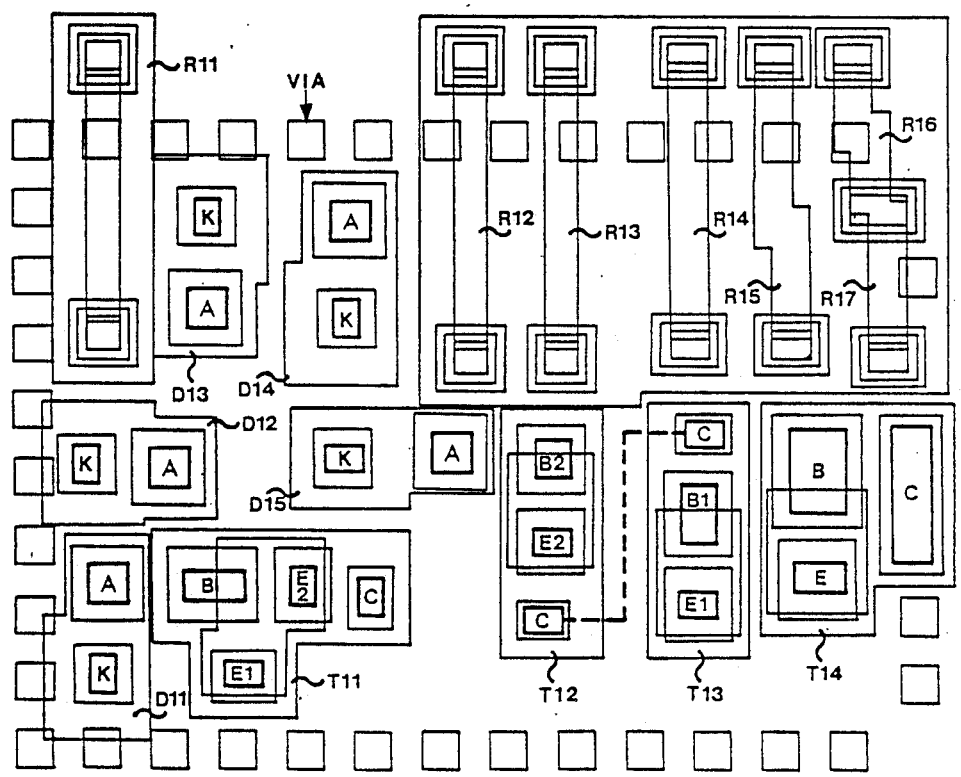

In a preferred embodiment, shown in FIG. 5A, the cell comprises five low-barrier Schottky diodes D11-D15, the cathodes of which shall form the inputs of the logic circuits, seven implanted resistors R11-R17, and four transistors T11-T14, one of which, T11, has two emitters. These elements are pre-diffused in an appropriate manner in the cell, as shown in FIG. 5B, which illustrates the first metallic layer. Their placement in the silicon of the master slice is such that the length of the connections between the elements is minimal, regardless of the type of logic circuit to be formed in the cell. Provision is made in each cell for a grid of 9×13 possible via holes. These are shown as squares in FIG. 5B. In the figure, the anodes and the cathodes of the Schottky diodes are designated A and K, respectively. The bases, the emitters and the collectors of the transistors are designated B, E and C, respectively. The antisaturation Schottky diodes provided between the collectors and the bases of transistors T11-T14 are not shown.

To realize a logic network, each cell is first customized by providing the contacts of the various pre-diffused elements and making all suitable connections between these elements in the first metallic layer to enable the cell to perform a given logic function, with the input/output (I/O) terminals being accessible through a number of logic service terminals (LSTs) provided at appropriate locations in the grid of 9×13 via holes, as shown in the figures which illustrate some examples of customization. The connections between individual cells are then made in the second and third metallic layers. Twenty-four wiring channels per cell are available for the purposes of all such interconnections, namely:

9 horizontal wiring channels provided in the third metallic layer,
13 vertical wiring channels provided in the second metallic layer, and
2 horizontal wiring channels provided in the first metallic layer, these being reserved for control lines.

When designing a logic network, the first step is to define the first metallic layer. For each I/O terminal, one primary LST and several secondary LSTs must be defined. When all desired logic functions have been defined in the matrix of cells on the master slice, a conventional program automatically defines the interconnections required between the primary I/O terminals. Where no interconnections can be made, a secondary LST is chosen. Only one of the via holes defined for a given I/O terminal is used. Since the other via holes are not provided in the customized cell, the interconnections can pass over them without contacting the I/O terminals. This method allows more flexibility and makes it possible to limit the length, the capacitance and the resistance of the conductive strips used to interconnect the cells.

All logic functions that can be performed by one or more general-purpose cells are prewired to provide the designer of logic circuits with a library of cells produced by means of a computer-aided design (CAD) method. The interconnections of the cells can be automatically defined by a program, in accordance with the teachings of European patent No. 79103921.7 (U.S. Pat. No. 4,295,210).

A partial list of the many logic functions that can be performed is given below. In view of the above description, one skilled in the art should experience no difficulty in making the necessary interconnections. Examples of the interconnections associated with certain logic functions will be given with reference to FIGS. 6 to 10.

| 2-INPUT FUNCTIONS | 3-INPUT FUNCTIONS |
|---|---|
| A and B | A, B and C |
| A$\overline{B}$ | AB$\overline{C}$ |
| $\overline{A}$B | B ($\overline{B}$ + $\overline{C}$) |
| $\overline{AB}$ | A$\overline{BC}$ |
| A + $\overline{B}$ | $\overline{ABC}$ |
| A + B | A$\overline{B}$ + C |
| $\overline{AB}$ + A$\overline{B}$ | A$\overline{B}$ + $\overline{C}$ |
| AB + $\overline{AB}$ | A$\overline{B}$ + C |
|  | $\overline{AB}$ + C |
|  | $\underline{A}B$ + C |
|  | A + B + C |
|  | $\overline{A + B + C}$ |

| 4-INPUT FUNCTIONS |  |
|---|---|
| A, B, C and D | |
| $\overline{ABCD}$ | A$\overline{B}$ + $\overline{CD}$ |
| A ($\overline{B}$ + $\overline{C}$ + $\overline{D}$) | AB$\overline{C}$ + D |
| A ($\overline{B}$ + C + D) | AB + CD |
| AB ($\overline{C}$ + $\overline{D}$) | AB + C$\overline{D}$ |
| ABCD | AB$\overline{C}$ + $\overline{D}$ |
| $\overline{ABCD}$ | A$\overline{B}$ + C + $\overline{D}$ |
| A ($\overline{B}$ + $\overline{C}$) + $\overline{D}$ | AB + $\overline{C}$ + D |
| A$\overline{BC}$ + D | AB + C + $\overline{D}$ |
| A$\overline{B}$ + CD | AB + $\overline{C}$ + $\overline{D}$ |
| AB$\overline{C}$ + $\overline{D}$ | A$\underline{B}$ + $\overline{C}$ + $\overline{D}$ |
|  | A$\overline{B}$ + $\overline{C}$ + $\overline{D}$ |

Figure 6B:
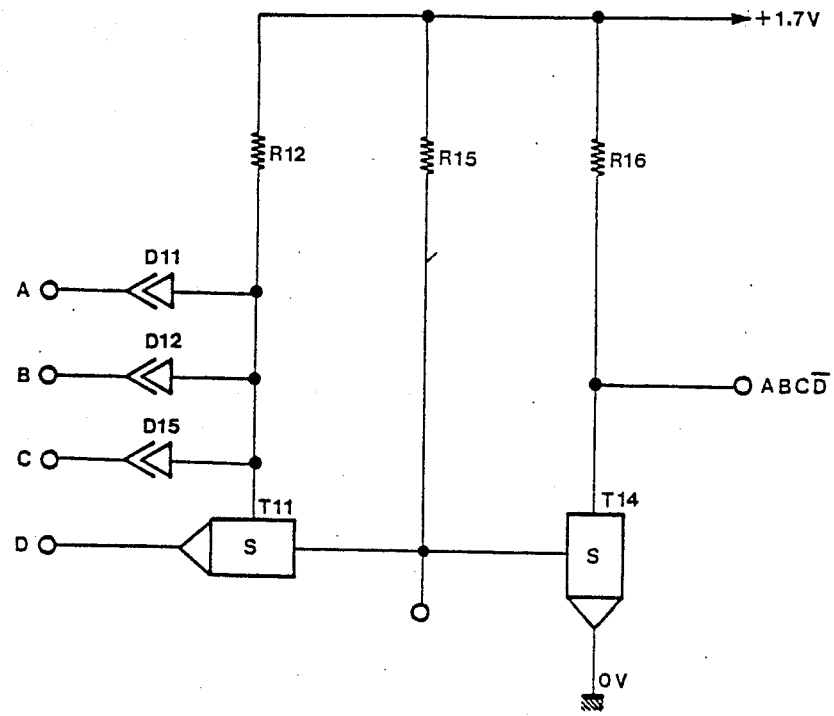
FIGS. 6A-10A illustrate the connections required to form the circuits shown in FIGS. 6B-10B in the cell.
Figure 6A:
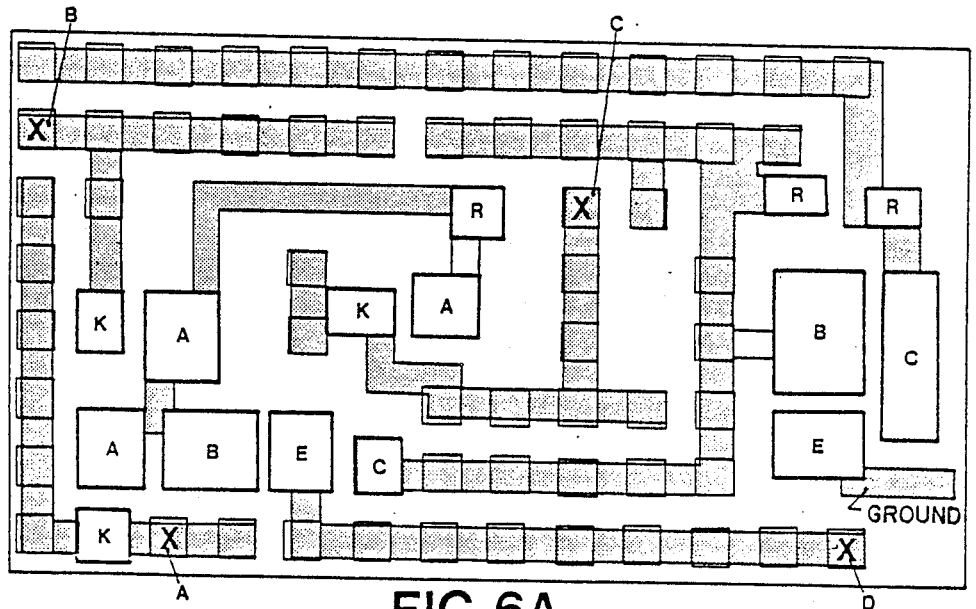

In FIG. 6A, the shaded portions represent the interconnections required to customize the basic cell schematically shown in FIG. 1B so that it will preform a 4-input function. The corresponding schematic is shown in FIG. 6B, in which the same reference numerals are used to designate semiconductor elements common to this figure and FIG. 5B.

Figure 7B:
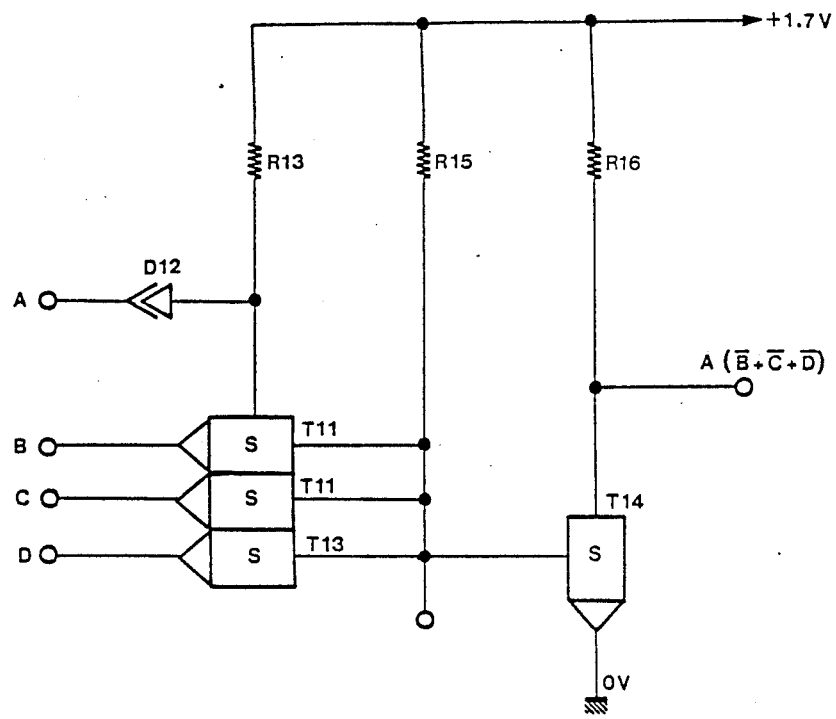
Figure 7A:
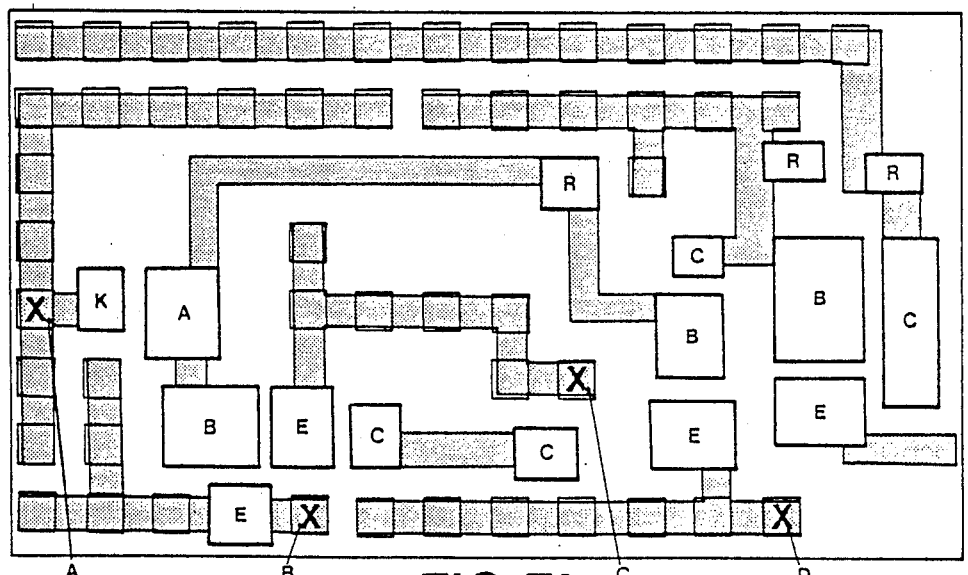

Similarly, the shaded portions of FIG. 7A show the interconnections necessary to enable the basic cell to perform the function $A(\overline{B}+\overline{C}+\overline{D})$. This cell comprises an input diode D12, to which logic signal A is applied, and three input transistors consisting of double-emitter transistor T11 and transistor T13 which has its collector connected to the collector of T12, as shown by a dashed line in FIG. 5B.

Figure 8B:
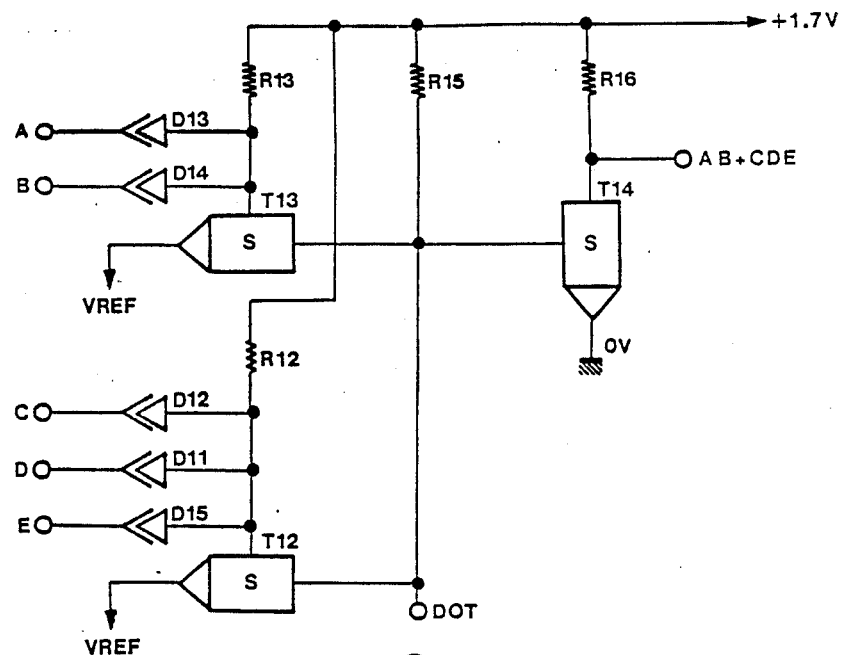
Figure 8A:
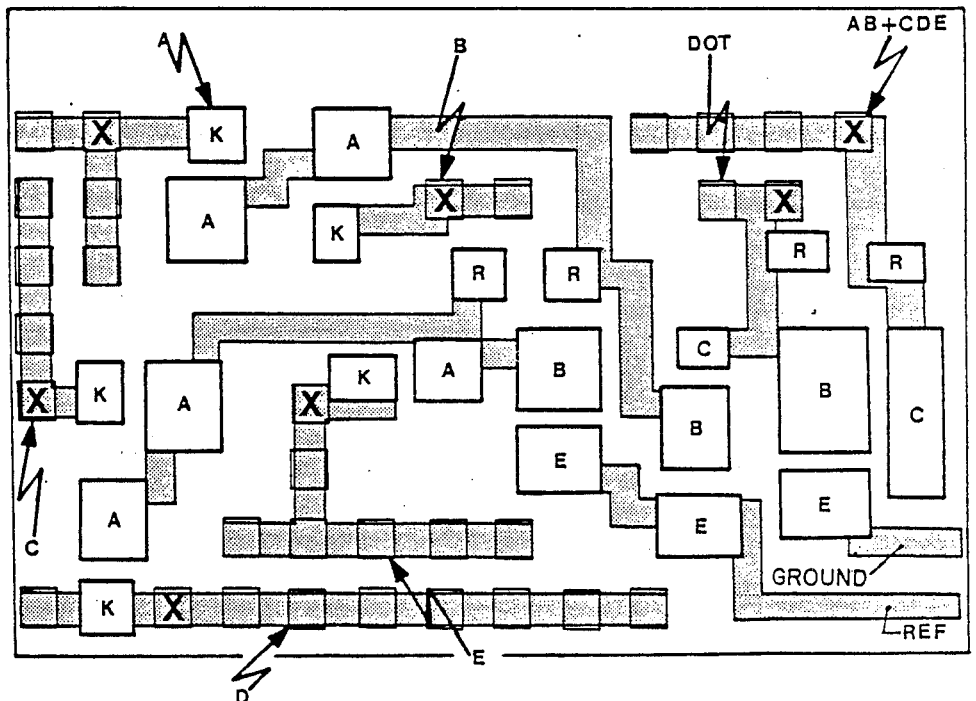

In FIG. 8A, the shaded portions represent the interconnections necessary in the instance of a cell capable of performing the logic function AB+CDE, where the emitters of transistors T13 and T12 are connected to the reference voltage as shown in the corresponding schematic of FIG. 8B. If the emitter of T13 receives the output X from another cell and the emitter of T12 receives the output Y from another cell, then the cell of FIG. 8A will perform the function $\overline{X}AB+\overline{Y}CDE$. If the emitters of T13 and T14 are connected together and receive the output X from another cell, then the cell of FIG. 8A will perform the function $\overline{X}$ (AB+CDE).

Figure 9B:
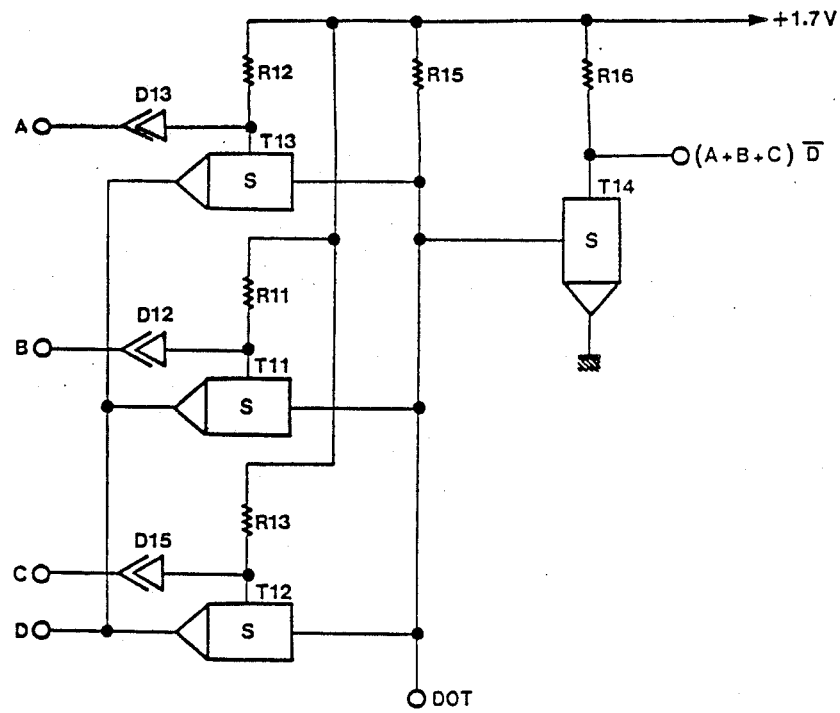
Figure 9A:
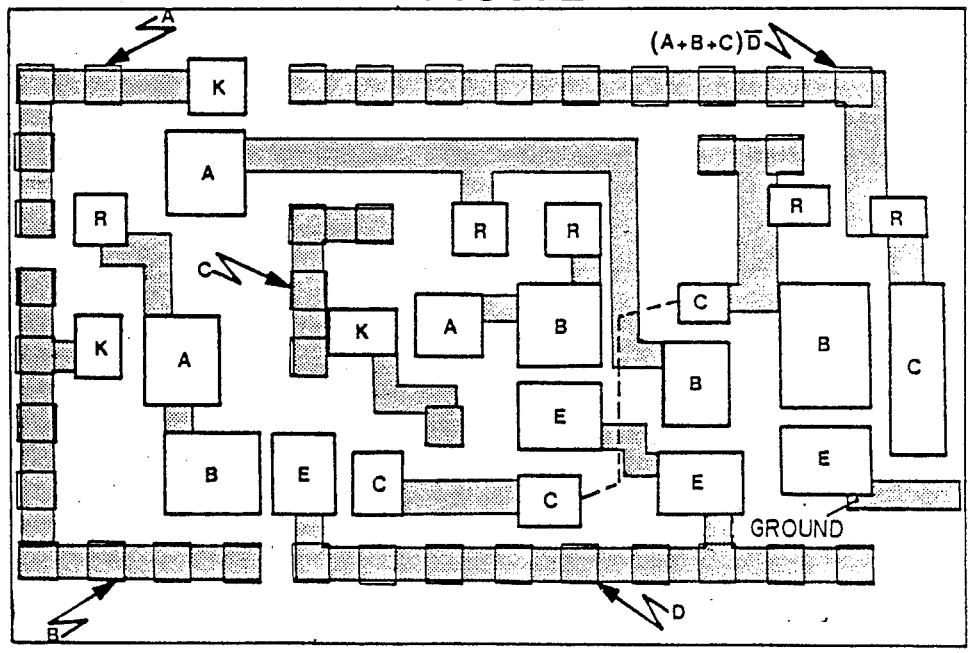

In FIG. 9A, the shaded portions represent the interconnections necessary to enable a cell to perform the logic function $(A+B+C) \overline{D}$. The corresponding schematic is shown in FIG. 9B.

Figure 10B:
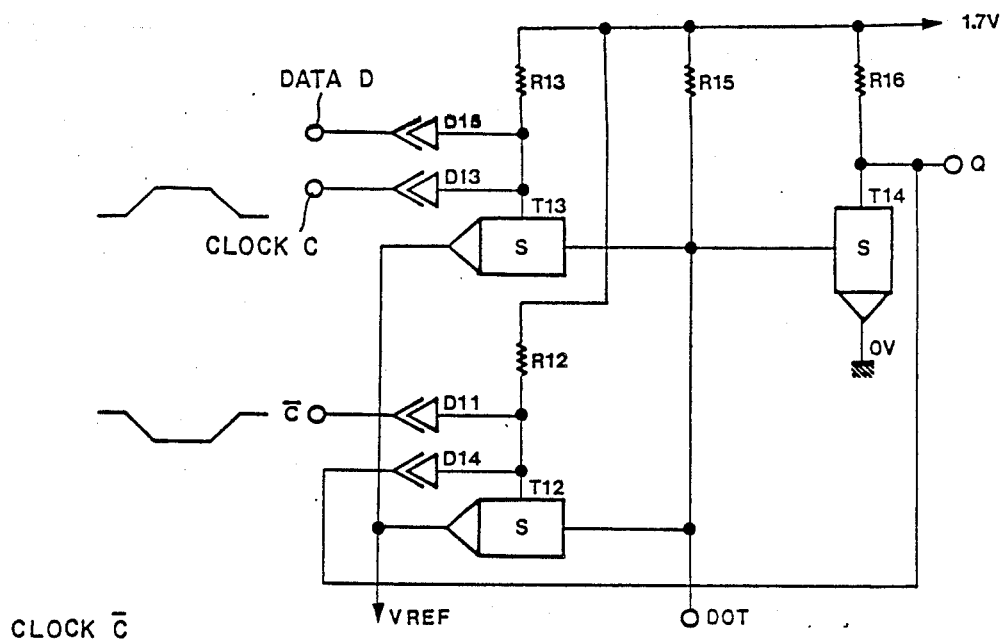
Figure 10A:
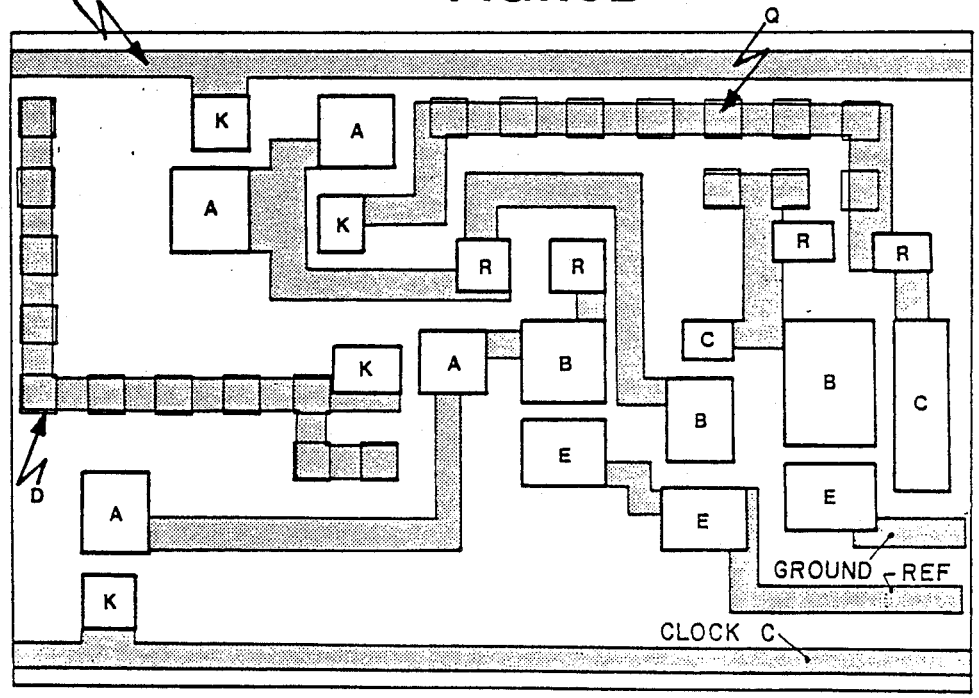

Many other interconnection patterns can be devised to produce cells performing a variety of logic functions or other logic circuits such as various types of latches. FIG. 10A provides an example of the interconnections required in the instance of a latch. The corresponding schematic is shown in FIG. 10B.

By interconnecting several cells, circuits capable of performing the complex logic functions frequently used in logic networks can be produced and added to the library of cells available to the designer.

Figure 11:
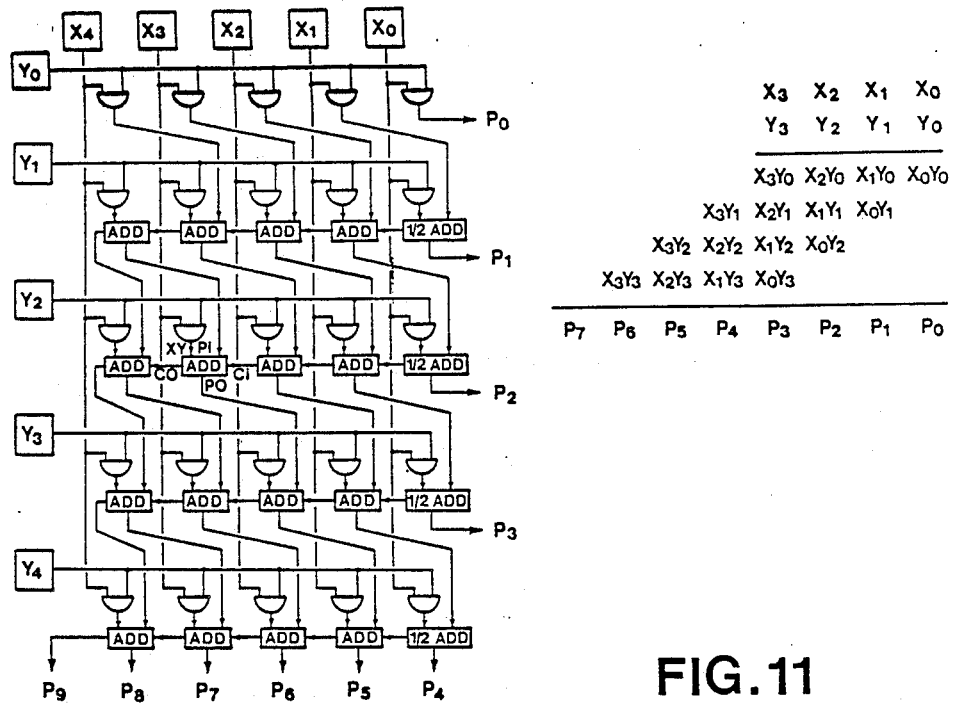
FIG. 11 is a schematic diagram of a multiplier.
Figure 12B:
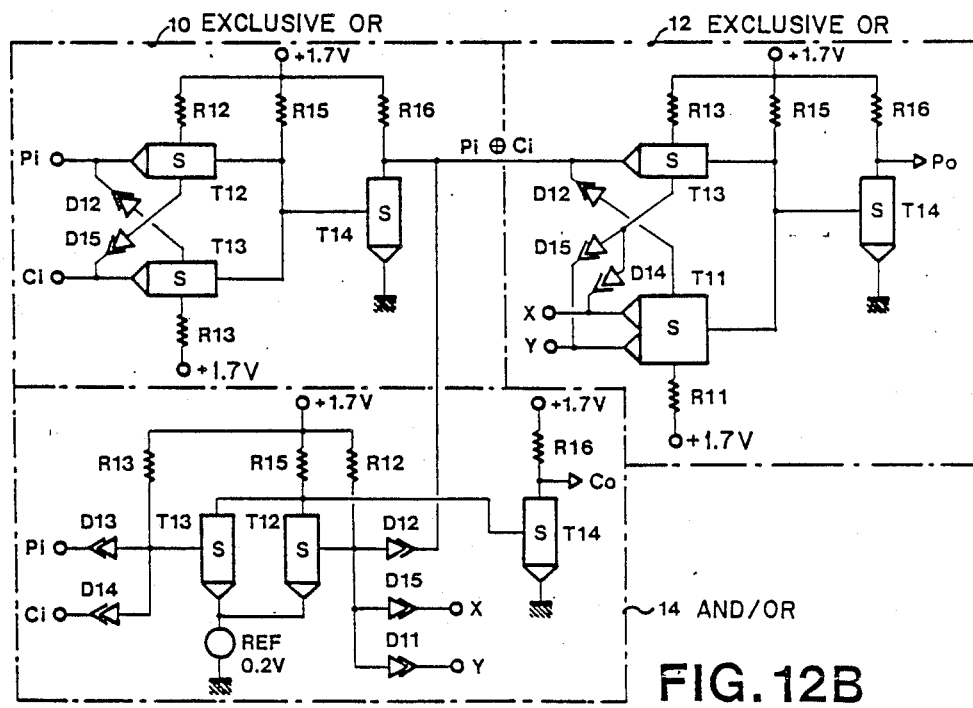
FIG. 12A shows the connections necessary to realize by means of three cells the multiplication circuit of FIG. 12B, which is an element of the multiplier of FIG. 11.
Figure 12A:
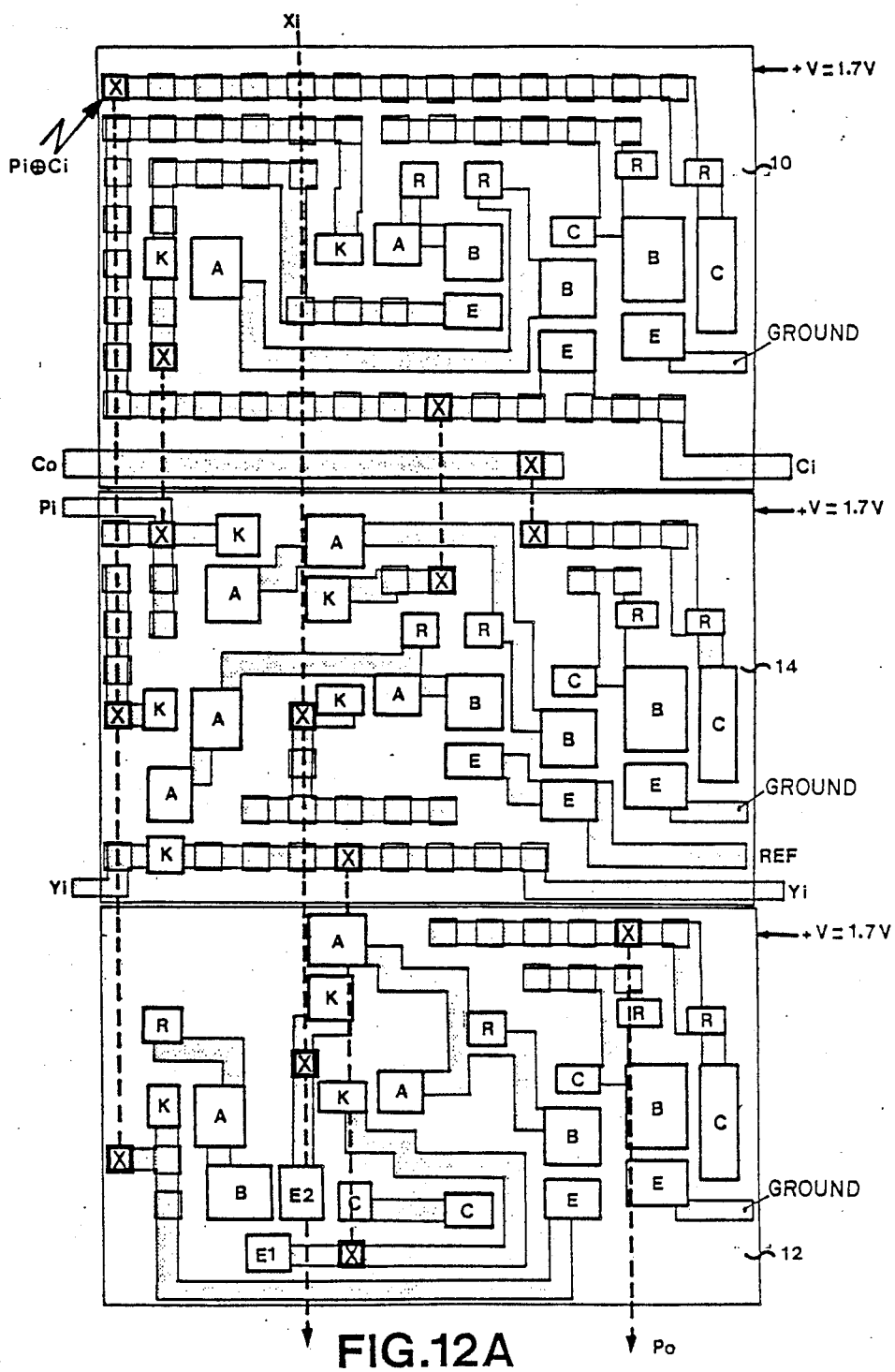

Referring now to FIGS. 12A and 12B, there is shown by way of example a multiplication/addition circuit comprising three cells which can be used as the basic component of a multiplication circuit of the type illustrated in FIG. 11. The circuit of FIG. 11 multiplies a multiplicand X3 X2 X1 X0 by a multiplier Y3 Y2 Y1 Y0 to yield the product P7 P6 P5 P4 P3 P2 P1 P0.

As shown, the multiplication circuit includes AND gates (represented by semicircles) and full- or half-adders designated ADD and ½ ADD. This arrangement, which is conventional and forms no part of the present invention, is merely intended to show the manner in which the circuit of FIG. 12B, which is a basic component of the multiplication circuit, can be used. The circuit of FIG. 12B comprises an AND gate and an adder ADD. The adder receives the product X Y of two bits of the multiplicand X and multiplier Y, the factor Pi from an adder ADD in the row immediately above, and the carry Ci from the right-hand adder ADD. Each adder generates the factors Po and Co which are the factors Pi and Ci destined for the row immediately below and the left-hand adder, as shown in FIG. 11.

Factors Po and Co are the results of the following logic functions:

$Po = (Pi \otimes Ci) \otimes XY$
$Co = Pi\, Ci + XY(Pi \otimes Ci)$

Thus, adder ADD as shown in FIG. 12B comprises a first Exclusive OR circuit 10 which includes transistors T12 and T13, diodes D12 and D15, output transistor T14, and resistors R12, R13, R15 and R16. Circuit 10 receives as inputs the factor Pi, which is applied to the emitter of T12 and to the cathode of D12, and the carry Ci, which is applied to the emitter of T13 and to the cathode of D15. The anode of D12 is connected to the base of T13, and the anode of D15 to the base of T12. The bases of T12 and T13 are connected to supply voltage +V=1.7 volt through resistors R12 and R13, respectively. The common collector of T12 and T13 is connected through R15 to voltage +V and to the base of output transistor T14. The emitter of T14 is connected to ground and its collector is connected to voltage +V through R16. Circuit 10 is a conventional Exclusive OR circuit, so that the output obtained at the collector of T14 is equal to $Pi \otimes Ci$.

The adder ADD of FIG. 12B includes a second Exclusive OR circuit 12 which has three inputs and is formed in a second cell. The layout of circuit 12 is similar to that of circuit 10. The circuit includes transistors T13 and T14 as well as transistor T11 the two emitters of which receive input signals X and Y. The emitter of T13 is connected to the output Pi x Ci of cell 10. The anode and the cathode of diode D12 are respectively connected to the base of T11 and to the emitter of T13. The anode and the cathode of diode D15 are respectively connected to the base of T13 and to one of the emitters of T11, while the anode and the cathode of diode D14 are respectively connected to the base of T13 and to the other emitter of T11. The output transistor is disposed in the same manner as in circuit 10. Consequently, circuit 12 provides the following output at the collector of T14:

$Po = (Pi \otimes Ci) \otimes XY$

The adder ADD of FIG. 12B further includes a circuit 14 formed in a third cell. Circuit 14 is identical to that shown in FIG. 8B and receives as inputs Pi, Ci, on the one hand, and $Pi \otimes Ci$, X and Y, on the other hand. Accordingly, circuit 14 provides the following output at the collector of transistor T14:

$Co = Pi\, Ci + XY(Pi \otimes Ci)$

The interconnections required for the components of the three cells are shown in FIG. 12A. The dashed lines show the connections made at the second level of metallization, using the vertical wiring channels, to interconnect the cells and allow input signals X, Y, Pi and Ci to be applied thereto.

While a circuit capable of performing a complex function has been shown and described above by way of example, it will be apparent that the present invention allows many similar circuits to be realized. For example, a parity tree comprised of Exclusive OR circuits would require eight cells; a one-bit multiplier, three cells; and a carry look-ahead circuit for a four-bit adder, four cells.

The general-purpose cell of FIG. 5B in which circuits of the DTTL family can be formed, makes it possible to design logic networks exhibiting an improved power-performance factor compared with that of logic circuits comprised of conventional NAND cells since many inverter stages can be eliminated, thereby shortening the signal paths. Also, the fact that complex logic functions can be prewired in a number of cells reduces the length of time required to design a logic network and minimizes the number of masks to be customized.

While the invention has been shown and described with reference to a preferred embodiment thereof it will be understood by those skilled in the art that various changes in form and details may be made therein without departing from the spirit and scope of the invention.

We claim:

1. A circuit for performing a basic logic function derived from n input signals (A, B, . . . ) comprising (a) a ground, (b) a positive supply source having a positive end an other end, said other end being connected to said ground,
   (c) first and second input transistor circuits and a single output transistor and said first input transistor circuit including
      (1 1) a first input transistor having a first base, a first collector and a first emitter,
      (2) a first plurality of input diodes each having a first electrode which receives one of a plurality of input signals, and
      (3) each of said diodes including a second electrode connected to a first common node,
      (4) said first common node being connected through a first resistor to a supply voltage, and said common node being connected to said first base,
   (d) said second input transistor circuit including
      (1) a second input transistor having a second base, a second collector and a second emitter,
      (2) a second plurality of input diodes,
         (i) each of said second plurality of input diodes having a first electrode which receives one of a plurality of input signals, and
         (ii) each of said diodes including a second electrode connected to a second common node connected through a second resistor to said supply voltage,
         (iii) said second common node being connected to said second base,
   (e) said collectors of said first and second input transistors being connected through a third and fifth resistor, respectively, to said supply voltage,
   (f) a first output inverter transistor
      (1) whose base is connected to the collector of said first input transistor,
      (2) whose emitter is connected to ground, and
      (3) whose collector is connected by a fourth resistor to said supply voltage,
   (g) an output coupled to said collector of said output inverter transistor,
   (h) a second output inverter transistor
      (1) whose base is connected to the collector of said second input transistor,
      (2) whose emitter is connected to ground, and
      (3) whose collector is connected in common with said collector of said first output inverter transistor by said fourth resistor to said supply voltage,
   (i) said emitter of said first input transistor being connected to emitter circuit means for providing an input signal X being positive with respect to ground,
   (j) said emitter of said second input transistor being connected to emitter circuit means for providing an input signal Y being positive with respect to ground,
whereby said emitter of said first input transistor circuit receives an input signal X and said emitter of said second input transistor receives an input signal Y, and whereby the output level at the common collector of the output transistors represents the logic function:

$$(\overline{X}AB\ldots)(\overline{Y}CD\ldots) \text{ with } A,B\ldots \text{ being the input}$$
signals applied to the first electrodes of the input diodes of the first circuit and C,D . . . being the input signals applied to the second electrodes of the input diodes of the second circuit.

2. A circuit for performing a basic logic function from n input signals (A,B . . . ) of the type including
   (a) (1) input low-barrier Schottky-diodes (D1–Dn) having first electrodes and second electrodes,
      (2) each of said diodes (D1–Dn) receiving one of said n input signals (INn),
   (b) first, second and third implanted resistors (R1, R2, and R3)
   (c) a first supply voltage (+V),
   (d) said second electrodes being connected to a common node connected through said first resistor (R1) to said first supply voltage (+V),
   (e) an input transistor (T1)
      (1) the base of which is connected to said common node,
      (2) the collector of which is connected through said second implanted resistor (R2) to said first supply voltage (+V), and
      (3) the emitter of which being connected to an element
         providing a reference voltage the value of which is equal to the low level of the input signal in order to provide a circuit well protected against noise,
   (f) a first output inverter transistor (T2)
      (1) the base of which is connected to the collector of said first input transistor (T1),
      (2) the emitter of which is connected to a second supply voltage (Ground) and
      (3) the collector of which is connected through said third implanted resistor (R3) to said first supply voltage (+V),
whereby the output level at the collector of said output transistor represents the logic function (A.B.C).

3. A circuit according to claim 2 wherein the value of said supply voltage is 1.7 volts and the value of said secondary supply voltage is zero volts.

4. A logic circuit including an elementary circuit in accordance with claim 2 wherein
   (a) k input low-barrier Schottky-diodes have their second electrodes connected to the base of a first input transistor, and
   (b) (n-k) input low-barrier Schottky-diodes have their first electrodes connected to the base of a second input transistor (T1-2),
   (c) said second input transistor having its emitter and collector connected to the emitter and collector of said first input transistor,
   (d) the base of said second transistor being connected to said first supply voltage through a fourth resistor (R1-2),
whereby the output level at the collector of said first output transistor represents the following logic function:

$$(AB\ldots+CD\ldots)$$

with A,B . . . being the input signals applied to the first electrodes of said k input low-barrier Schottky-diodes and C,D . . . being the input signals applied to the first electrodes of said (n−k) input low-barrier Schottky-diodes.

5. A logic characterized in that it includes an elementary circuit according to claim 3, wherein
   (a) k input low-barrier Schottky-diodes have their second electrodes connected to the base of a first input transistor, and
   (b) (n−k) input low-barrier Schottky-diodes have their first electrodes connected to the base of a second input transistor (TI12),
   (c) said second input transistor having its emitter and collector connected to the emitter and collector of said first input transistor,
   (d) the base of said second transistor being connected to said first supply voltage through a fourth resistor (R1-2), (AB...+CD...)

with A,B... being the input signals applied to the first electrodes of said k input low-barrier Schottky-diodes, and C,D... being the input signals applied to the first electrodes of said (n−K) input low barrier Schottky-diodes.

6. A logic circuit in accordance with claim 2, comprising
   (a) a general-purpose cell of a matrix of cells in a semiconductor masterslice,
   (b) with each cell including
      (1) n input diodes,
      (2) at least six implanted resistors and
      (3) at least four transistors which are pre-diffused in the cell and can be interconnected to provide the desired logic circuit.

7. A circuit in accordance with claim 6 wherein
   (a) said pre-diffused elements are interconnected at the first level of metallization, within each cell, and
   (b) the other levels of metallization are solely used for interconnecting the cells to provide logic networks.

8. A circuit for performing a basic logic function derived from n input signals (A,B,...) comprising:
   (a) a plurality of input low-barrier Schottky diodes (D1, D2, D3) each having a first electrode and a second electrode each one of said first electrodes being connected to a terminal (IN1, IN2, IN3) for receiving one of a plurality of input signals, and
   (b) each of said second electrodes being connected to a common node itself connected through a first resistor (R1) to a one end of a source (+V) of a supply voltage, said one end being the positive voltage end of said source (+V);
   (c) a ground connected to the other end of said source (+V) of supply voltage,
   (d) a first input NPN transistor (T1)
      (1) whose base is connected to said common node,
      (2) whose emitter is connected to means (1) for providing a voltage with respect to ground having a minimum positive value substantially equal to the collector-emitter potential of said input transistor (T1), and
      (3) whose collector is connected through a second resistor (R2) to said positive supply voltage;
   (e) a first output inverter transistor (T2)
      (1) whose base is connected to the collector of said first input transistor (T1),
      (2) whose emitter is connected to said ground, and
      (3) whose collector is connected through a third resistor (R3) to said source (+V);
   (f) an output (OUT) coupled to said collector of said output inverter transistor (T2).

9. A circuit in accordance with claim 8 wherein
   said base of said input transistor is connected to said collector of said input transistor by means of an antisaturation, high barrier Schottky diode, and
   said base of said output transistor is connected to said collector of said output transistor by means of an antisaturation, high barrier Schottky diode.

10. A circuit for performing a basic logic function derived from a plurality of (n) input signals (A, B, ...) supplied to a plurality of (n) input diodes (D1, D2, D3, D4...) comprising:
   (a) a plurality (k) of said input diodes (D1, D2...) arranged in an input AND gate,
   (b) a ground,
   (c) a positive supply voltage source (+V) having a positive end and an other end connected to said ground,
   (d) emitter circuit means (X or VREF) for providing a positive reference voltage source having a positive end and an other end, said other end being connected to said ground,
   (e) each of said diodes (D1, D2) having
      (1) a first electrode (A, B) for receiving one of said input signals with respect to said ground, and
      (2) a second electrode connected to a common node and through a first resistor (R1-1) to a source (+v) of supply voltage;
   (f) a first input transistor (T1-1) having a first base connected to said common node,
      (1) said first input transistor (T1-1) having a first emitter connected to the positive end of said emitter circuit means (X or VREF),
      (2) said emitter circuit means (X or VREF) providing at said emitter a positive potential value equal to or greater than about the collector-emitter potential of said first input transistor (T1-1), and
      (3) said first input transistor (T1-1) having a first collector connected through a second resistor (R2) to said positive end of said source (+V)/
   (g) an output inverter transistor (T2)
      (1) whose base is connected to said collector of said first input transistor (T1-1),
      (2) whose emitter is connected to ground, and
      (3) whose collector is connected through a third resistor (R3) to said source (+V);
   (h) an output coupled to said collector of said output inverter transistor (T2),
   (i) a second input transistor (T1-2) having a second base as well as a second emitter and a second collector, with said second emitter and said second collector being connected to said first emitter and said first collector, respectively, of said first input transistor (T1 1)
   (j) a plurality (n−k) of said input diodes (D3, D4...) having their second electrodes connected to the base of said second input transistor (T1-2),
   (k) said base of said second input transistor (T1-2) being connected to said source (+V) through a fourth resistor (R1-2), whereby the output level at the collector of said first output transistor (T2) represents the logic function $\overline{X}$ (AB... +CD...), or (AB... +CD...), with A,B ... being the input signals applied to the first electrodes of said k input diodes (D1, D2 ... ), and C, D ... being the input signals applied to the first electrodes of said n−k input diodes (D3, D4 ... ), whereby said circuit is immune to false positive values on said n diodes caused by false inputs such as noise on the inputs to said n diodes because of the protection provided by said positive potential value.

11. A circuit for performing a basic logic function derived from input signals (A, B, ... ) comprising
   (a) a ground,
   (b) a positive supply voltage source (+V) having a positive end and an other end, said other end being connected to said ground
   (c) a plurality of emitter circuit means (x,y, ... ) for providing a plurality of positive reference voltage inputs including input signal X and input signal Y, each of said emitter circuit means (x,y ... ) having a positive end and an other end, said other end being connected to said ground
   (d) first and second input transistor circuits (T1-1, T1-2) and a single output transistor (T2),
   (e) said first input transistor circuit including
      (1) said first input transistor (T1-1) having a first base, a first collector and a first emitter,
      (2) a first plurality of input diodes (D1,D2 ... ) each having a first electrode which receives one of a plurality of input signals, and each of said diodes including a second electrode connected to a first common node,
      (3) said first common node being connected through a first resistor (R1-1) to said positive supply voltage source (+V),
      (4) said first common node being connected to said first base,
   (f) said second input transistor circuit (T1-2) including
      (1) a second input transistor (T1-2) having a second base, a second collector and a second emitter,
      (2) said second collector being connected to said first collector of said first input transistor (T1-1),
      (3) a second plurality of input diodes (D3,D4, ... ), each of said second plurality of input diodes having a first electrode which receives one of a plurality of input signals C and D, ... each of said diodes (D3,D4, ... ) including a second electrode connected to a second common node,
      (4) said second common node being connected through a second resistor (R1-2) to said source (+V) of supply voltage, said second common node being connected to said second base,
   (g) said collectors of said first and second input transistors (T1-1, T1-2) being connected in common through a third resistor (R2) to said supply voltage (+V),
   (h) a first output inverter transistor (T2)
      (1) whose base is connected to the collector of said first input transistor (T1-1),
      (2) whose emitter is connected to ground, and
      (3) whose collector is connected by a fourth resistor to said supply voltage,
   (i) an output (OUT) coupled to said collector of said output inverter transistor,
   (j) said emitter of said first input transistor (T1-1) being connected to said emitter circuit means for providing said positive input signal X with respect to said ground,
   (k) said emitter of said second input transistor being connected to said emitter circuit means for providing said positive input signal Y with respect to said ground,
   (l) said input X and Y each having a minimum value substantially equal to the collector-emitter potential of the corresponding input transistor (T1-1, T1-2, ... ), whereby the output level at the collector of said output transistor represents the logic function:

$$\overline{X}(AB\ldots)+\overline{Y}(CD\ldots)$$

with A,B ... being input signals applied to the first electrodes of the input diodes of the first circuit and C,D ... being the input signals applied to the second electrodes of the input diodes of the second circuit.

12. A circuit for performing a basic logic function derived from n input signals (A, B, ... ) comprising
   (a) a ground,
   (b) a positive supply voltage source having a positive end and an other end, said other end being connected to said ground
   (c) emitter circuit means for providing a positive reference voltage source having a positive end and an other end, said other end being connected to said ground,
   (d) first and second input transistor circuits,
   (e) said first input transistor circuit including
      (1) a first input transistor having a first base, a first collector and a first emitter,
      (2) a first plurality of input diodes each having a first electrode which receives one of a plurality of input signals, and each of said diodes including a second electrode connected to a first common node,
      (3) said first common node being connected through a first resistor to a supply voltage,
      (4) said first common node being connected to said first base,
   (f) a second input transistor circuit including
      (1) a second input transistor having a second base, a second collector and a second emitter,
      (2) said second collector being connected to said first collector of said first input transistor,
      (3) a second plurality of input diodes, each of said second plurality of input diodes having a first electrode which receives one of a plurality of input signals, and each of said diodes including a second electrode connected to a second common node,
      (4) said second common node being connected through a second resistor to said supply voltage, and said second common node being connected to said second base,
   (g) said diodes including a second electrode connected to a second common node connected through a second resistor to said supply voltage, said second common node being connected to said second base,
   (h) said collectors of said first and second input transistors being connected in common through a third resistor to said supply voltage,
   (i) a first output inverter transistor
      (1) whose base is connected to the collector of said first input transistor,
      (2) whose emitter is connected to ground, and (3) whose collector is connected by a fourth resistor to said supply voltage, (j) an output coupled to said collector of said output inverter transistor, (k) said emitters of said first and second input transistors being connected together to means for providing a common input signal X, (l) said input signal X having a minimum value substantially equal to the collector-emitter potential of said input transistors, whereby the output level at the collector of said output transistor represents the logic function:

$$\overline{X}(AB\ldots +CD\ldots).$$

with A,B . . . being the input signals applied to the first electrodes of the input diodes of the first circuit and C,D . . . being the input signals applied to the second electrodes of the input diodes of the second circuit.

13. A circuit for performing a basic logic function from n input signals (A, B . . . ), comprising;
(a) a ground,
(b) a positive supply voltage source having a positive end and an outer end, said other end being connected to said ground
(c) emitter circuit means for providing a positive reference voltage source having a positive end and an other end, said other end being connected to said ground,
(d) n low-barrier Schottky diodes arranged in an input AND gate,
 (1) each of said diodes having a first electrode receiving one of said n input signals with respect to said ground, and
 (2) each of said diodes having a second electrode connected to a common node and through a first resistor to said positive supply voltage source;
(e) a first input transistor
 (1) whose base is connected to said common node,
 (2) said first transistor having an emitter connected to said positive end of said emitter circuit means said emitter circuit means having a positive potential value equal to or greater than about the collector-emitter potential of said input transistor, and
 (3) said first transistor having a collector connected through a second resistor to said positive supply voltage source;
(f) an output inverter transistor
 (1) whose base is connected to the collector of said first input transistor,
 (2) whose emitter is connected to ground, and whose collector is connected through a third resistor to said positive supply voltage source;
(g) an output coupled to said collector of said output inverter transistor,
whereby said circuit is immune to false positive values on said n diodes caused by false inputs such as noise on the inputs to said n diodes because of the protection provided by said positive potential value.

14. A circuit in accordance with claim 13 wherein said base of said first transistor is connected to said collector of said first transistor by means of an antisaturation, high barrier Schottky diode, and
said base of said second transistor is connected to said collector of said second transistor by means of an antisaturation, high barrier Schottky diode.

15. A circuit in accordance with claim 13 wherein said reference voltage source has a value of about 0.3 volts.

16. A circuit in accordance with claim 15 wherein said base of said first transistor is connected to said collector of said first transistor by means of an antisaturation, high barrier Schottky diode, and
said base of said second transistor is connected to said collector of said second transistor by means of an antisaturation, high barrier Schottky diode.

17. A circuit for performing a basic logic function from n input signals (A, B), comprising:
(a) a ground,
(b) a positive supply voltage source having a positive end and an other end, said other end being connected to said ground
(c) a logic circuit having an output for providing a switchable positive output signal with respect to said ground,
(d) n diodes arranged in an input AND gate,
 (1) each of said diodes having a first electrode receiving one of said n input signals with respect to ground, and
 (2) each of said diodes having a second electrode connected to a common node and through a first resistor to a supply voltage;
(e) a first input transistor
 (1) whose base is connected to said common node,
 (2) said first input transistor having an emitter connected to the output of said logic circuit for receiving said output signal therefrom,
 (3) said output signal having a positive potential value within the ends of said range extending from about 0.3 Volts at one end to about 1.7 Volts at the other end, said logic circuit switching said output signal from one end of said range to the other end of said range, and
 (4) said first input transistor having a collector connected through a second resistor to said supply voltage;
(f) an output inverter transistor
 (1) whose base is connected to the collector of said first input transistor
 (2) whose emitter is connected to ground, and
 (3) whose collector is connected through a third resistor to said supply voltage;
(g) an output coupled to said collector of said output inverter transistor,
whereby said circuit is immune to false positive values on said n diodes caused by false inputs such as noise on the inputs to said n diodes because of the protection provided by said positive potential value.

* * * * *

UNITED STATES PATENT AND TRADEMARK OFFICE
CERTIFICATE OF CORRECTION

PATENT NO. : 4,950,927

DATED : August 21, 1990

INVENTOR(S) : Gerard Boudon, Armand Brunin, Bernard Denis, Pierre Mollier, Philippe Stoppa It is certified that error appears in the above-identified patent and that said Letters Patent is hereby corrected as shown below:

Column 9, Claim 1, line 3, after "supply" please insert --voltage--;

line 4, between the words "end an" please insert --and--;

line 9, before "a first" delete (1 1) and please insert --(1)--.

Signed and Sealed this

Thirtieth Day of June, 1992

*Attest:*

DOUGLAS B. COMER

*Attesting Officer*      *Acting Commissioner of Patents and Trademarks*